United States Patent [19]
Murakami et al.

[11] Patent Number: 5,389,604
[45] Date of Patent: Feb. 14, 1995

[54] PROCESS OF PRODUCING OXIDE SUPERCONDUCTOR

[75] Inventors: Masato Murakami; Naomichi Sakai; Hiroshi Takaichi, all of Koto; Akihiro Kondoh, Kobe; Shoichi Kagiya; Naomichi Nakamura, both of Koto; Hiroyuki Fujimoto, Kokubunji; Naoki Koshizuka; Shoji Tanaka, both of Koto, all of Japan

[73] Assignees: Nippon Steel Corporation, Tokyo; Tosoh Corporation, Yamaguchi; Kawasaki Jukogyo Kabusiki Kaisha, Hyogo; Hokuriku Electric Power Company, Toyama; Kawasaki Steel Corporation, Hyogo; Railway Technical Research Institute, Tokyo; International Superconductivity Technology Center, Tokyo, all of Japan

[21] Appl. No.: 77,378

[22] Filed: Jun. 17, 1993

[30] Foreign Application Priority Data

Sep. 14, 1992 [JP] Japan .................. 4-245303

[51] Int. Cl.$^6$ .................. H01B 1/00; H01L 39/00
[52] U.S. Cl. .................. 505/450; 505/742; 505/780; 505/500; 252/518; 252/521; 164/122
[58] Field of Search .................. 505/1, 742, 780; 252/518, 521; 164/122

[56] References Cited

U.S. PATENT DOCUMENTS 5,262,391  11/1993  Morita et al. .................. 505/1

FOREIGN PATENT DOCUMENTS 61-235512  4/1985  Japan .

OTHER PUBLICATIONS

S. Jin et al., "High Critical Currents in Y–Ba–Cu–O Superconductors", Appl. Phys. Lett. 52(24), 13 Jun. 1988, pp. 2074–2076.

M. Murakami, "Melt Processing of YBaCuO Superconductors and Critical Currents", Mod. Phys. Lett. B vol. 4, No. 3, (1990), pp. 163–179.

Primary Examiner—Paul Lieberman
Assistant Examiner—M. Kopec
Attorney, Agent, or Firm—Wenderoth, Lind & Ponack

[57] ABSTRACT

To ensure a well-oriented crystal structure, there is provided a process of producing an oxide superconductor of a Y—Ba—Cu—O system with a composition having an atomic ratio Y:Ba:Cu of 1.0–2.0:2.0–2.5:3-.0–3.5, the process comprising the steps of: preparing a semimelt including solid and liquid phases and consisting of Y, Ba, Cu and O in the atomic ratio; and solidifying the semimelt to form the oxide superconductor by so controlling a moving speed of a solidification front to have two components of different values in two perpendicularly intersecting directions.

4 Claims, 9 Drawing Sheets

Polarized optical micrograph (a cross section)

PROCESS OF PRODUCING OXIDE SUPERCONDUCTOR

BACKGROUND OF THE INVENTION

1. Field of the Invention

The present invention relates to a process of producing an oxide superconductor of the Y—Ba—Cu—O system (hereinafter simply referred to as "Y-based [oxide] superconductor") with well-controlled crystal orientation. The Y-based superconductor according to the present invention is applicable as superconducting bearings, superconducting electromagnetic transporters, superconducting permanent magnets, magnetic shields, etc.

2. Description of the Related Art

It is known that oxide superconductors, particularly Y-based superconductors, have an extremely improved critical current density when crystallized or solidified from a partially molten or semimolten state, than when produced by sintering (Jin et al., Appl. Phys. Lett. 52 (1988), p.2074).

New melting processes such as the "melt-powder-melt growth (MPMG) process" provide a fine dispersion of a normal conductor phase in a superconductor crystal to ensure a high critical current density even in a strong magnetic field (M. Murakami, Mod. Phys. Lett. B4 (1990), p.163 and U.S. Ser. No. 07/606,207).

The MPMG process includes heating and melting a powder of a Y-based superconductor composition at about 1300° to 1450° C., quenching the melt to form a solidified body, and pulverizing the solidified body to form a fine powder. A compact body formed from the fine powder is brought into a semimolten state and the semimelt is then slowly cooled from about 1000° C. The thus-produced superconductor material exhibits a strong repulsive force against a magnet and is expected to be useful as a superconductor bearing, etc.

As oxide superconductors, particularly those having a perovskite structure, are anisotropic in property, the crystal orientation is desirably controlled for practical applications. For example, it is known that electric current preferentially flows along the a-or b-axis (hereinafter collectively referred to as "a/b-axis") of the crystal structure. Jin et al. achieved an improvement in the critical current density by utilizing a temperature gradient during the crystallization or solidification from semimelt and thereby forming a crystal structure oriented in the preferential direction.

The conventional processes using the temperature gradient, however, have not yet succeeded in perfect control of the crystal orientation. For example, FIG. 1 shows that the crystal growth proceeds with the ab-axis directed along the temperature gradient, but the c-axis is not fixed. This is fully acceptable for application to wires or tapes, which only require a current flow in the longitudinal direction, i.e., along the a/b-axis providing the preferential current flow path.

On the other hand, in applications requiring a two-dimensional current flow such as bearings, the direction of the c-axis must be also controlled in order to improve service performance. Moreover, members having a greater thickness than wires or tapes are subjected to the influence of temperature distribution over the thickness and thereby mostly include regions which are differently oriented.

SUMMARY OF THE INVENTION

The object of the present invention is to provide a process of producing an oxide superconductor with the crystal orientation well controlled even when having a large mass or volume.

To achieve the object according to the present invention, there is provided a process of producing an oxide superconductor of a Y—Ba—Cu—O system with a composition having an atomic ratio Y:Ba:Cu of 1.0–2.0:2.0–2.5:3.0–3.5, the process comprising the steps of:

preparing a semimelt including solid and liquid phases and consisting of Y, Ba, Cu and O in the atomic ratio; and solidifying the semimelt to form the oxide superconductor by so controlling a moving speed of a solidification front to have components of different values in two perpendicularly intersecting directions.

The solidification step of the process according to the present invention is typically carried out by an MPMG process.

The present invention uses a bidirectional control of the moving speed of the solidification front, instead of the conventional unidirectional control, i.e., the moving speed of the solidification front is not only controlled with respect to one direction but also controlled simultaneously with respect to another direction perpendicularly intersecting the former. The moving speed has components of different values in these two directions.

Preferably, the different values of two components of the moving speed of the solidification front in two perpendicularly intersecting directions have a ratio therebetween of 2 or more, and more preferably, the greater one of the two different values of the moving speed of the solidification front is not more than 0.5 cm/hr.

Typically, the oxide superconductor has a perovskite structure and the two perpendicularly intersecting directions correspond to ab- and c-axes of the perovskite structure.

Y-based oxide superconductors are anisotropic regarding the crystal growth speed with respect to the crystal orientation. For example, it was reported that the crystal growth speed is about 20 times greater in the a/b-axis direction than in the c-axis direction and that the a/b-axis of the crystal is aligned in the direction of the maximum crystal growth speed when solidification or crystallization is carried out by slow cooling under a condition which ensures stable crystal growth. This enables the crystal orientation to be controlled by using different values of the moving speed of the solidification front with respect to two directions.

The moving speed of the solidification front is given by the ratio of the cooling speed of a solidifying mass to the temperature gradient within the mass, and therefore, can have components of different values in two perpendicularly intersecting directions when the solidification is carried out by cooling the mass with different temperature gradients maintained in the mass with respect to the two perpendicularly intersecting directions.

FIG. 2 shows the relationship between the moving speed of the solidification front in the a/b- and c-axis directions and the product crystal orientation. The blank circle indicates that perfect crystal orientation is obtained, i.e., the crystalline product is entirely oriented in one direction. The solid circle indicates imperfect crystal orientation, i.e., the crystalline product includes regions oriented in different directions.

FIG. 3 shows a pseudo-binary phase diagram, in which the composition of the superconductor according to the present invention ranges from a composition of pure $YBa_2Cu_3O_x$ phase (hereinafter simply referred to as "123 phase") to a composition consisting of 123 phase and about 33% of $Y_2BaCuO_x$ phase (hereinafter the latter simply referred to as "211 phase"). A superconductor crystal is grown by slowly cooling a material with a composition in this range from a temperature just above a solidification temperature (shown by the tie line "D") at which the 211 phase and a liquid phase ($BaCuO_2+CuO$) react. During this slow cooling, the bidirectional temperature gradient is used to control the crystal orientation according to the present invention. Preferably, the slow cooling is carried out to a temperature of 900° C. or lower to complete the crystal growth.

The present invention thus enables a large piece of oxide superconductor to be produced with the crystal orientation well controlled so that a device can be equipped with a superconductor arranged with the preferential orientation thereof aligned against a magnetic field to improve the performance of the device, including the repulsive force against a magnet.

The bidirectional control of solidification according to the present invention, i.e., the control of the moving speed of the solidification front in two perpendicularly intersecting directions, is typically realized by providing two perpendicularly arranged pairs of mutually facing heaters in a heat-treatment furnace, establishing, by these pairs of heaters, temperature gradients in two perpendicularly intersecting directions within a volume of the furnace in which a compact body of a superconductor composition is placed, and cooling the entire volume with the bidirectional temperature gradient maintained during cooling.

DESCRIPTION OF THE PREFERRED EMBODIMENTS

EXAMPLE 1

$Y_2O_3$, $BaCO_3$ and $CuO$ powders were mixed in a proportion which provided a powder mixture having an atomic ratio Y:Ba:Cu of 1.8:2.4:3.4. The powder mixture was calcined at 900° C. for 8 hr to decompose the $BaCO_3$ thereby providing a chemical composition substantially corresponding to that of a final superconductor product. The calcined powder was then heated at 1400° C. for 20 min to form a solid/liquid mixture consisting of solid $Y_2O_3$ phase and liquid $BaCuO_2$ and $CuO$ phases, as can be seen from the pseudo-binary equilibrium phase diagram shown in FIG. 3. The solid/liquid mixture was quenched by bringing it into contact with cold copper plates to form a solid bulk consisting of solid $Y_2O_3$, $BaCuO_2$ and $CuO$ phases. The quenched bulk was ground or pulverized by a stamp mill to form a fine powder, which was then mixed with 10 wt % of silver oxide ($Ag_2O$). This powder mixture was pressed by cold isostatic pressing under a pressure of 2000 atm, to form a compact sample having a shape as shown in FIG. 4.

The sample was heated at 1000° C. for 20 min to form a semimelt in which solid $Y_2BaCuO_x$ or 211 phase and liquid $BaCuO_2$ phase coexisted, followed by cooling to 1000° C. in 1 hr and then slowly cooling to 870° C. at a cooling rate of 1° C./hr. This slow cooling was carried out with a bidirectional temperature gradient over the sample, i.e., with a temperature gradient of 20° C./cm in the horizontal direction (denoted by arrow "A" in FIG. 4) and a temperature gradient of 5° C./cm in the vertical direction (arrow "B"), respectively, according to the present invention.

A comparative sample was also prepared by the same process steps as described above, except that the slow cooling from 870° C. was carried out with a unidirectional temperature gradient of 20° C./cm in the horizontal direction "A" alone.

Figure 4:
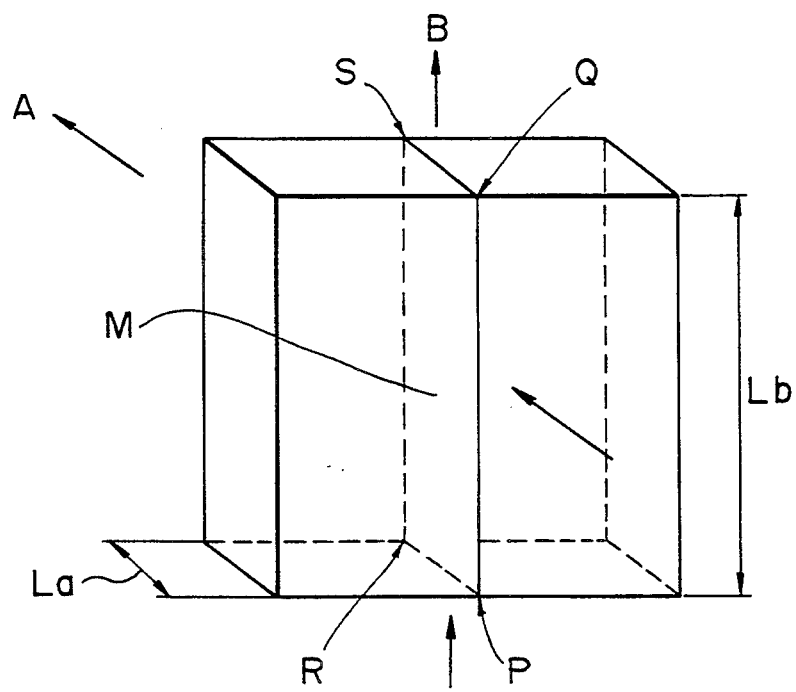
FIG. 4 shows a compact body of the superconductor composition subjected to the process according to the present invention.
Figure 5C:
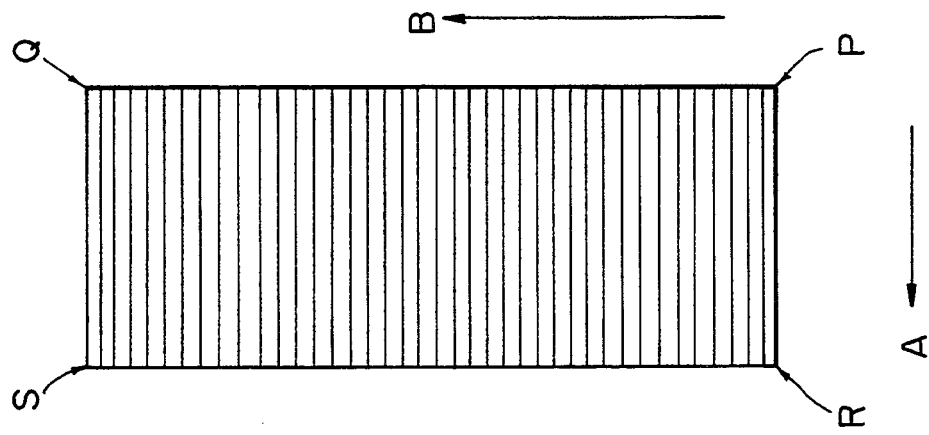
FIGS. 5A, 5B and 5C schematically illustrate the sequential crystal growth process according to the present invention, in cross-sectional view along the vertical plane "M" of FIG. 4.
Figure 5B:
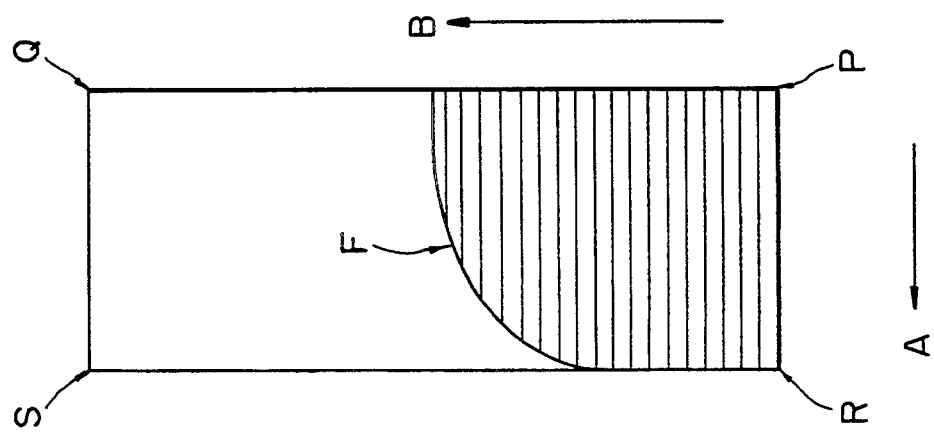
Figure 5A:
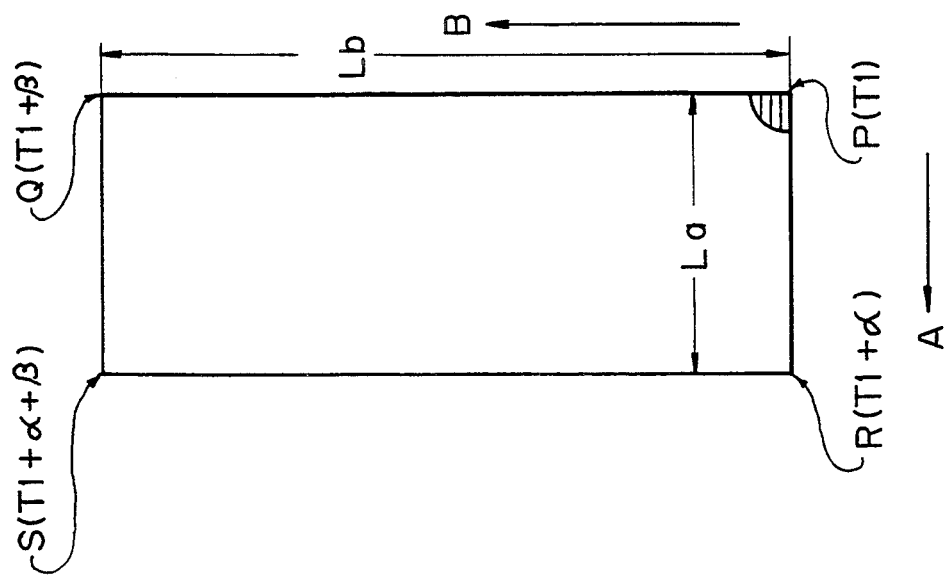

FIGS. 5A, 5B and 5C schematically illustrate the initial, intermediate and final stages of the sequential process of crystal growth from a semimelt, in cross-sectional view along the vertical plane "M" shown in FIG. 4 that includes both the horizontal and vertical axes "A" and "B". The plane "M" is defined by horizontal segments PR and QS having a length La and vertical segments PQ and RS having a length Lb.

Referring to FIG. 5A, the semimelt sample shown in FIG. 4 is entirely cooled so that corners "P", "Q", "R" and "S" are temporarily held at temperatures T1, T1+β, T1+α, and T1+α+β, respectively. The temperature increment α in the horizontal direction is given by multiplying the horizontal temperature gradient (dTa) by the horizontal length La; and the temperature increment β in the vertical direction is given by multiplying the vertical temperature gradient (dTb) by the vertical length Lb. The combined bidirectional temperature gradient composed of the horizontal and vertical components dTa and dTb is maintained unchanged throughout the solidification process. No temperature gradient is provided in the direction perpendicular to the plane "M".

Figure 1:
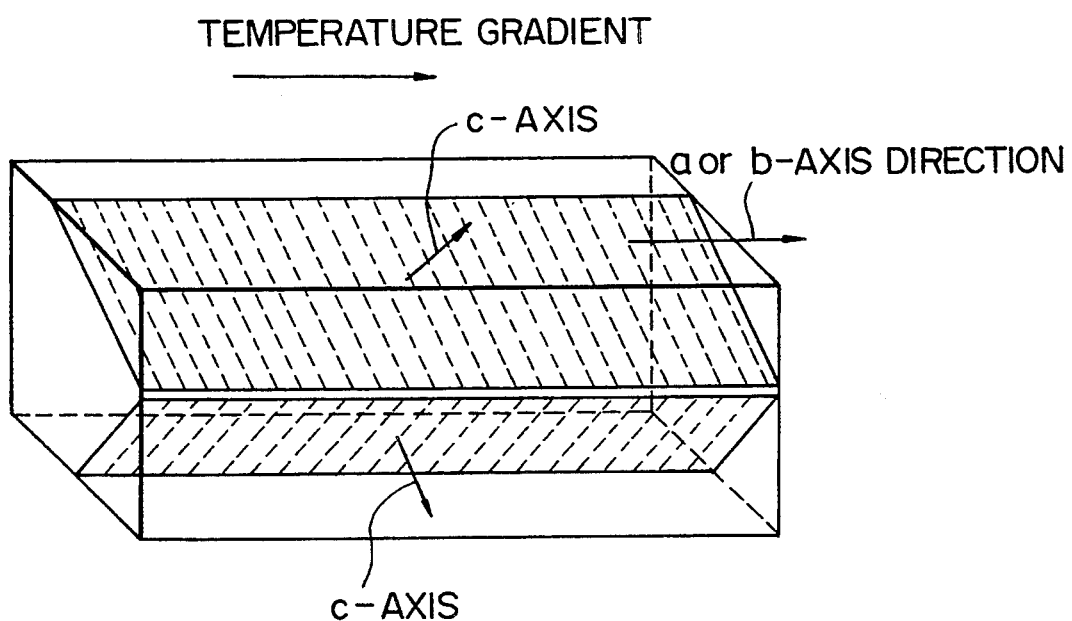
FIG. 1 schematically illustrates the crystal orientation of the conventional oxide superconductor produced by solidification from a semimelt by using a conventional unidirectional temperature gradient, in perspective view.
Figure 2:
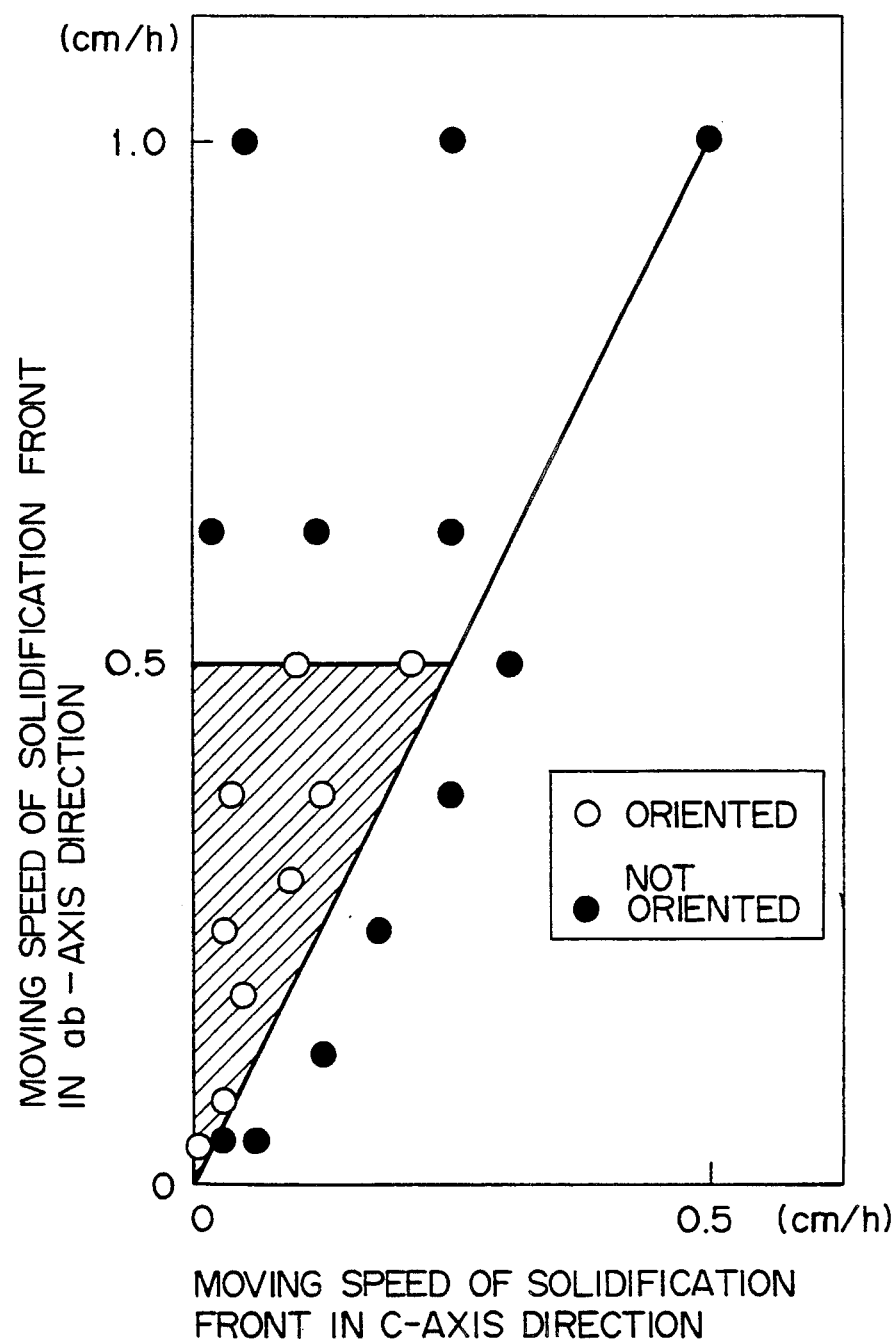
FIG. 2 is a graph showing the relationship between the crystal orientation and the moving speed of solidification front having components in horizontal and vertical directions according to the present invention.
Figure 3:
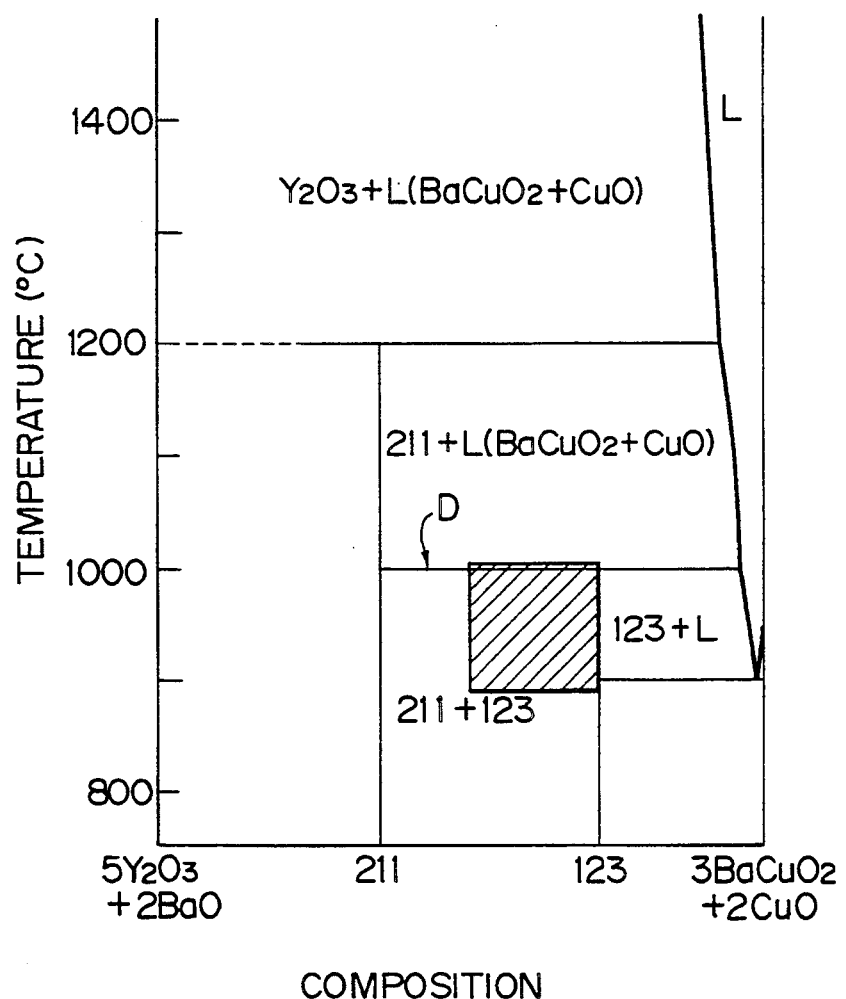
FIG. 3 shows a pseudo-binary phase diagram including the superconductor composition according to the present invention.

Solidification is initiated at the lower right corner "P" held at the lowest temperature T1, as shown by a hatched sector, when the temperature T1 is lowered to reach the temperature corresponding to the tie line "D" shown in FIG. 3.

Referring to FIG. 5B, as the temperature of the sample is further lowered by the slow cooling, the solidification proceeds from the lower right corner "P" towards the upper left corner "S" held at the highest temperature T1+α+β, with the solidification front "F" moving along or directed by the upward slope of the bidirectional temperature gradient maintained throughout the sample. The solidification front "F" forms a curved surface extending linearly in the direction perpendicular to the plane "M". The solidified portion of the sample, shown by the hatched area, is composed of the superconductive 123 phase containing a fine dispersion of the normal conductive 211 phase.

Referring to FIG. 5C, the sample is completely solidified. The solidified sample is further cooled slowly to 870° C. to complete the crystal growth in a solid state.

Figure 6A:
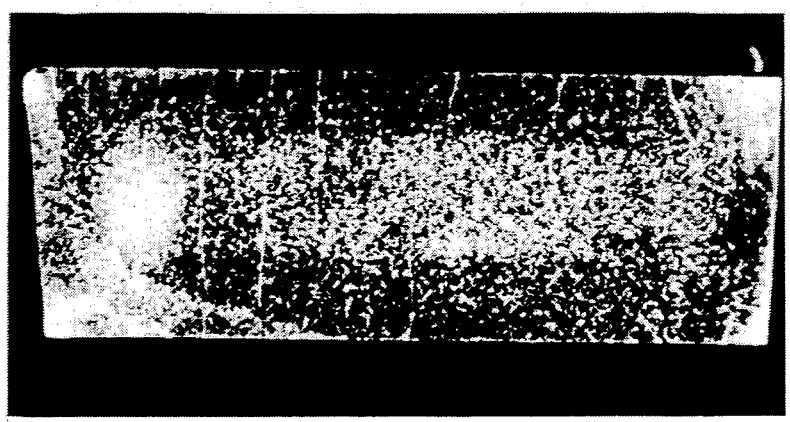
FIGS. 6A and 6B show the crystal structures of the solidified superconductor products obtained by (A) the present inventive process and (B) the conventional process, respectively.
Figure 6B:
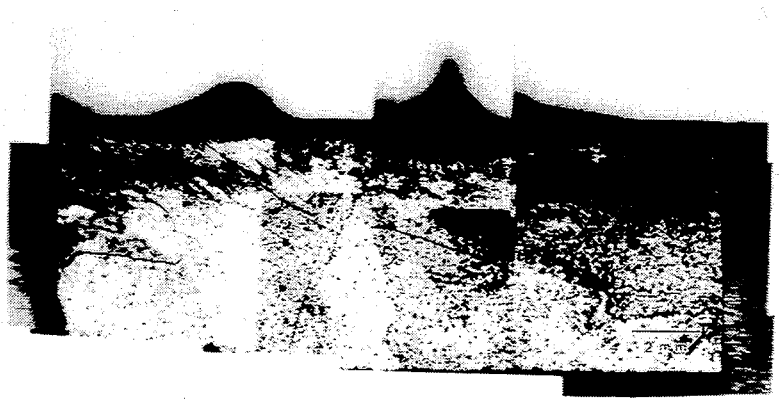

FIGS. 6A and 6B are photographs showing crystal structures of the superconductor sample produced by the process according to the present invention using a bidirectional temperature gradient and of the comparative sample produced by the conventional process using a unidirectional temperature gradient, respectively. It can be seen from these figures that the superconductor according to the present invention has a crystal structure well oriented in one direction whereas the comparative sample includes crystals in different orientations.

Figure 7:
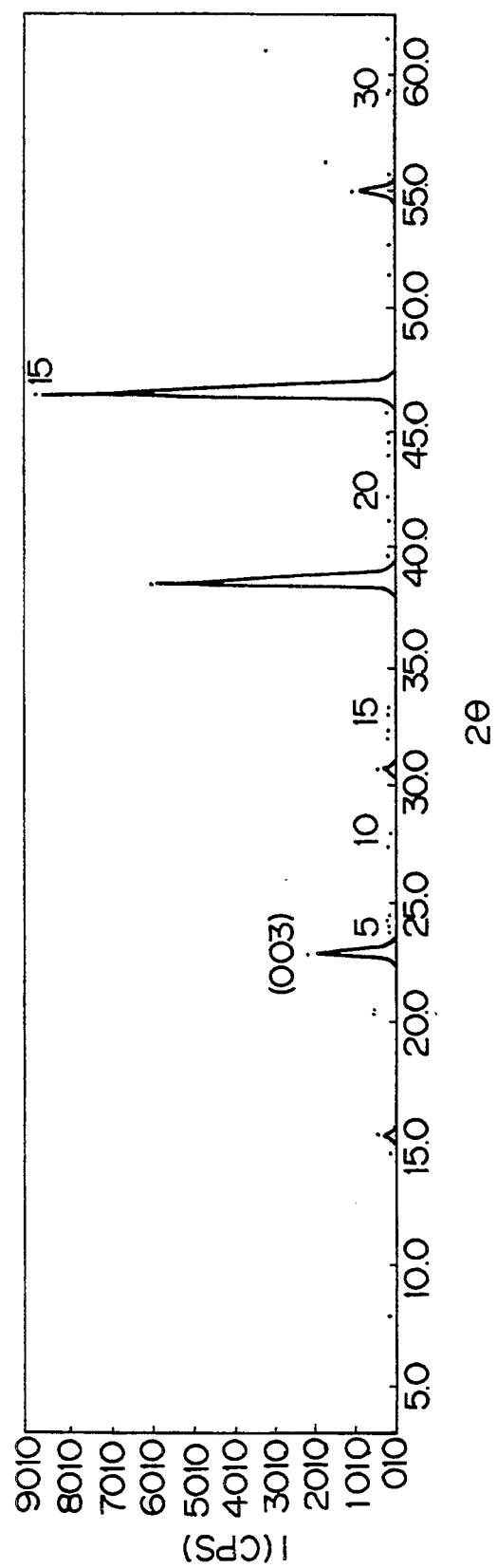
FIGS. 7 and 8 show X-ray diffraction charts for superconductor products produced by the present inventive process and the conventional process, respectively.
Figure 8:
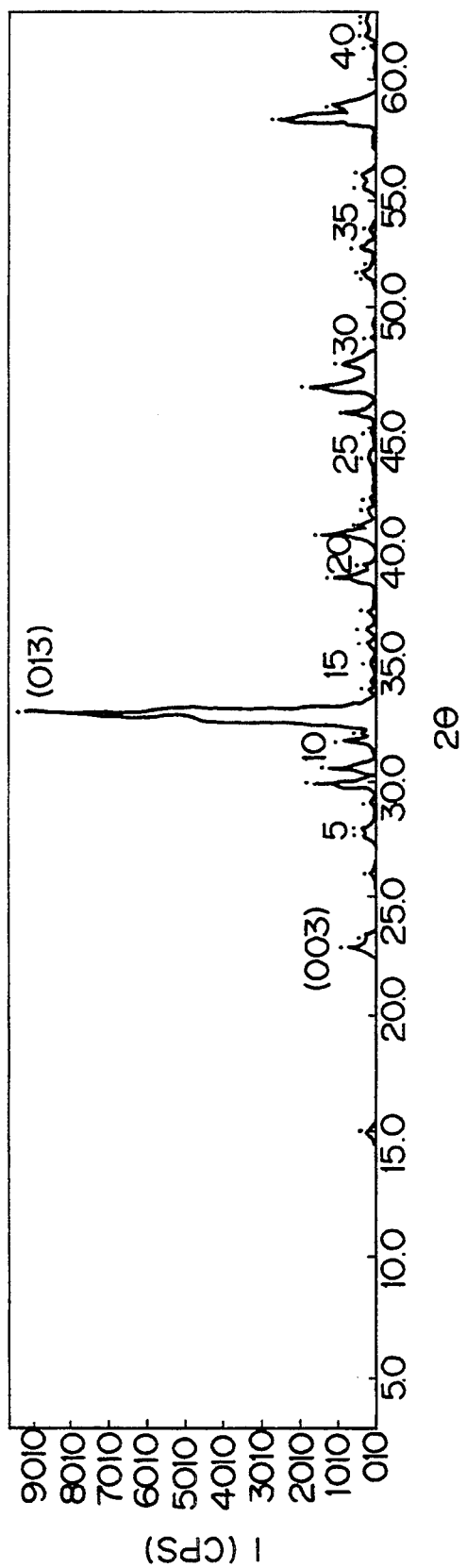

FIGS. 7 and 8 show X-ray diffraction charts of the sample crystallized by using a bidirectional temperature gradient according to the present invention and of the comparative sample crystallized by using a unidirectional temperature gradient, respectively. Only (001) peaks were observed in FIG. 7 to indicate a complete crystal orientation established in the former, whereas in the latter, other peaks were also observed in FIG. 8.

The degree of crystal orientation is quantitatively evaluated in terms of the peak intensity ratio $10 \times I_{(003)}/(10 \times I_{(003)} + I_{(013)})$, i.e., the ratio between diffraction intensities of (003) and (013) peaks. The diffraction intensity of (003) peaks is multiplied by 10 to correct the difference between diffraction intensities of (003) and (013) peaks obtained from a standard sample having a random orientation. This evaluation yielded values of the degree of orientation of 1.0 and 0.42 for the samples obtained by bidirectional and unidirectional temperature gradients, respectively.

EXAMPLE 2

Six pieces of the pressed compact samples were prepared by the same process steps as used in Example 1.

The samples were heated at 1100° C. for 20 min, cooled to 1000° C. in 1 hr, and then slowly cooled to 870° C. at different cooling rates of from 0.1 to 10° C./hr. The slow cooling was carried out with a bidirectional temperature gradient maintained over the sample, i.e., with temperature gradients of 20° C./cm in the horizontal direction (denoted by arrow "A" in FIG. 4) and 5° C./cm in the vertical direction (arrow "B"), respectively.

The thus-crystallized superconductor samples were subjected to X-ray diffraction analysis to evaluate the degree of crystal orientation in terms of the peak intensity ratio as used in Example 1. The results are summarized in Table 1. A rate of cooling from 870° C. of greater than 5° C./hr is too high with respect to the crystal growth speed, with the result that the degree of crystal orientation is lowered and the crystal growth becomes unstable, failing to provide the effect of bidirectional temperature gradient according to the present invention. Therefore, the cooling from 870° C. is preferably not faster than 5° C./hr.

On the other hand, a cooling rate less than 0.1° C./hr is expected to provide a good crystal orientation with a stable crystal growth. The minimum value of 0.1° C./hr was merely limited by the control system used.

TABLE 1

| Cooling rate (°C./hr) | Degree of crystal orientation |
| --- | --- |
| 0.1 | 1.00 |
| 1 | 1.00 |
| 2 | 1.00 |
| 5 | 0.85 |
| 6 | 0.80 |
| 10 | 0.50 |

EXAMPLE 3

$Y_2O_3$, $BaCO_3$ and $CuO$ powders were mixed in a proportion such that the resulting mixture had an atomic ratio Y:Ba:Cu of 1.4:2.2:3.2. The powder mixture was calcined at 900° C. for 8 hr. The calcined powder was heated at 1400° C. for 20 min, quenched, and pulverized to a fine powder, which was then pressed to a 10×10×5 mm compact sample.

The sample was heated at 1100° C. for 20 min, cooled to 1000° C. in 1 hr, and then slowly cooled to 900° C. at a cooling rate 1° C./hr. This slow cooling was carried out with the 10×10 mm surface of the sample placed along the vertical direction and with horizontal and vertical temperature gradients varied in the range of from 1 to 10° C./cm.

The thus-crystallized superconductor samples were subjected to X-ray diffraction analysis to evaluate the degree of crystal orientation in terms of the peak intensity ratio as used in Example 1. The results are summarized in Table 2. As the X-ray diffraction data were obtained for the direction perpendicular to the 10×5 mm surface of the samples, the degree of crystal orientation takes either the values of 1.00 or 0 when the a/b-axis is either parallel with or perpendicular to the vertical direction (i.e., the c-axis is either perpendicular to or parallel with the vertical direction), respectively.

TABLE 2

| Temperature Gradients in Two Directions and Degree of Crystal Orientation | | |
| --- | --- | --- |
| Temperature gradient (°C./cm) | | Degree of crystal orientation |
| Horizontal | Vertical | |
| 1 | 2 | 0.60 |
| 1 | 20 | 0.55 |
| 20 | 5 | 0.50 |
| 20 | 5 | 1.00 |
| 5 | 20 | 0 |
| 30 | 15 | 1.00 |
| 30 | 20 | 0.80 |
| 2 | 3 | 0.60 |
| 2.5 | 4 | 0.55 |
| 4 | 5 | 0.4 |
| 8 | 8 | 0.5 |
| 1.5 | 30 | 0.4 |
| 1.5 | 8 | 0.6 |
| 1.5 | 4 | 0.55 |
| 2 | 10 | 1.00 |
| 2 | 5 | 1.00 |
| 2.5 | 20 | 1.00 |

TABLE 2-continued

| Temperature Gradients in Two Directions and Degree of Crystal Orientation | | |
|---|---|---|
| Temperature gradient (°C./cm) | | Degree of crystal orientation |
| Horizontal | Vertical | |
| 10 | 3 | 1.00 |

In the slow cooling of the sample entirely with the bidirectional temperature gradient maintained, the maximum value of the temperature gradient in each direction was limited to 30° C./cm because of the control system using two perpendicularly arranged pairs of mutually facing heaters.

Greater temperature gradients will be achieved if the sample is forcibly cooled on one side.

Temperature gradients less than 5° C./cm did not provide the effect of the present invention, probably because a small temperature gradient cannot actually control the crystal growth, i.e., a stable crystal growth proceeds too fast to be directed by a small temperature gradient.

It can be also seen from the result that the degree of crystal orientation is small, when the ratio between temperature gradients in two directions is less than 2 and the difference between crystal growth speeds in two directions is accordingly small.

EXAMPLE 4

$Y_2O_3$, $BaCO_3$ and $CuO$ powders were mixed in different proportions to provide mixtures having different values of the atomic ratio Y:Ba:Cu of 1.0:2.0:3.0, 1.5:2.0:3.0, and 2.0:2.5:3.5. The powder mixtures were calcined at 900° C. for 8 hr. The calcined powder was milled and calcined again at 900° C. for 8 hr. The twice calcined powder was milled and pressed to a 10×10×5 mm compact sample.

The sample was heated at 1100° C. for 20 min, cooled to 1000° C. in 1 hr, and then slowly cooled to 900° C. at a cooling rate of 1.5° C./hr. This slow cooling was carried out with the 10×10 mm surface of the sample placed along the vertical direction and with horizontal and vertical temperature gradients maintained at 30 and 10° C./cm, respectively.

The thus-crystallized superconductor samples were subjected to X-ray diffraction analysis to evaluate the degree of crystal orientation in terms of the peak intensity ratio as used in Example 1. The X-ray diffraction data were obtained for the direction perpendicular to the 10×5 mm surface of the samples. In all of three samples having different compositions, the degree of crystal orientation was 1.00, indicating a perfect orientation.

According to the present invention, a superconductor must have a composition with an atomic ratio Y:-Ba:Cu within the specified range of 1.0–2.0:2.0–2.5:3-.0–3.5. When the composition is outside this range, the connectivity of a superconductive phase is lost, irrespective of the crystal orientation.

Figure 9:
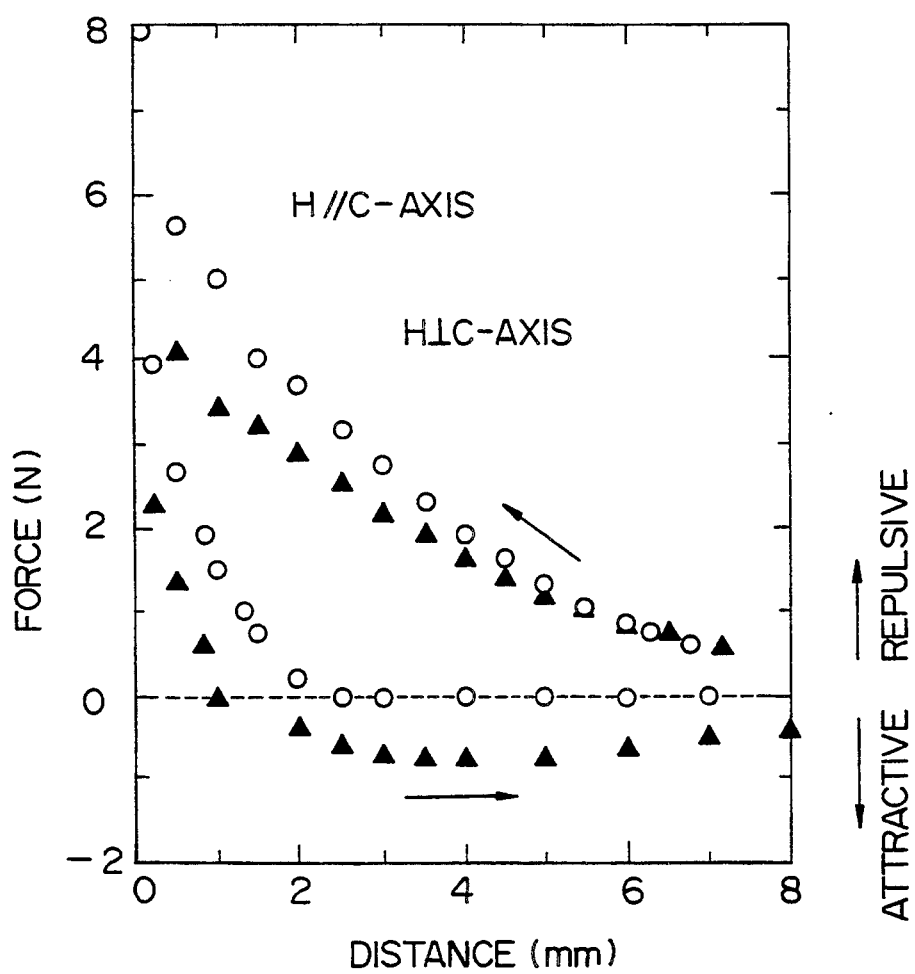
FIG. 9 is a graph showing the repulsive and attractive forces exhibited by a superconductor product in a magnetic field, according to the present invention.

To measure the repulsive force against magnet, a 10×10×10 mm specimen cut from the sample produced in Example 1 was subjected to a magnetic field "H" generated by a permanent magnet in a direction either parallel with or perpendicular to the c-axis of the specimen. The results are summarized in FIG. 9, in which the repulsive or attractive forces are plotted against the distance between the specimen and the permanent magnet.

The repulsive force is two times greater when the magnetic field "H" is applied in parallel with the c-axis than when applied perpendicularly to the c-axis. In practical use, the parallel arrangement will provide an about 1.5 times greater force.

The same specimen was subjected to a magnetic field of 1T while it was cooled to 77K, where the trapping magnetic field was measured as 1T at the center of the specimen under a magnetic field applied in parallel with the c-axis. This value is about five times greater than the value of 0.2 T obtained for the conventional sample produced in Example 1.

As hereinabove-described, the present invention provides a process of producing an oxide superconductor in the form of a large piece which can be advantageously applied for superconducting bearings, superconducting magnetic transporters, magnetic shields or the like.

We claim:

1. A process of producing an oxide superconductor of a Y—Ba—Cu—O system with a composition having an atomic ratio Y:Ba:Cu of 1.0–2.0:2.0–2.5:3.0–3.5, said process comprising the steps of:
   preparing a semimelt including solid and liquid phases and consisting of Y, Ba, Cu and O in said atomic ratio; and
   solidifying said semimelt to form said oxide superconductor by so controlling a moving speed of a solidification front to have two components of different values in two perpendicularly intersecting directions, wherein the temperature gradients of the two perpendicularly intersecting directions are at least about 1° C./cm.

2. A process according to claim 1, Wherein the different values of two components of the moving speed of the solidification front in two perpendicularly intersecting directions have a ratio therebetween of 2 or more.

3. A process according to claim 2, wherein the greater one of two different values of the moving speed of the solidification front is not more than 0.5 cm/hr.

4. A process according to claim 1, wherein the oxide superconductor has a perovskite structure and the two perpendicularly intersecting directions correspond to a/b- and c-axes of the perovskite structure, respectively.

* * * * *